US009726991B2

(12) United States Patent
Baselmans et al.

(10) Patent No.: US 9,726,991 B2
(45) Date of Patent: Aug. 8, 2017

(54) PATTERNING DEVICE, METHOD OF PRODUCING A MARKER ON A SUBSTRATE AND DEVICE MANUFACTURING METHOD

(71) Applicant: ASML Netherlands B.V., Veldhoven (NL)

(72) Inventors: Johannes Jacobus Matheus Baselmans, Oirschot (NL); Franciscus Godefridus Casper Bijnen, Valkenswaard (NL); Daniëlle Elisabeth Maria Palmen, Eindhoven (NL)

(73) Assignee: ASML NETHERLANDS B.V., Veldhoven (NL)

(*) Notice: Subject to any disclaimer, the term of this patent is extended or adjusted under 35 U.S.C. 154(b) by 77 days.

(21) Appl. No.: 14/764,522

(22) PCT Filed: Mar. 6, 2014

(86) PCT No.: PCT/EP2014/054340
§ 371 (c)(1),
(2) Date: Jul. 29, 2015

(87) PCT Pub. No.: WO2014/139855
PCT Pub. Date: Sep. 18, 2014

(65) Prior Publication Data
US 2015/0370174 A1  Dec. 24, 2015

Related U.S. Application Data

(60) Provisional application No. 61/784,803, filed on Mar. 14, 2013.

(51) Int. Cl.
*G03F 9/00* (2006.01)
*G03F 7/20* (2006.01)
(Continued)

(52) U.S. Cl.
CPC ............. *G03F 9/708* (2013.01); *G03F 1/42* (2013.01); *G03F 1/44* (2013.01); *G03F 7/70058* (2013.01)

(58) Field of Classification Search
CPC ........ G03F 7/70058; G03F 9/708; G03F 1/42; G03F 1/44
See application file for complete search history.

(56) References Cited

U.S. PATENT DOCUMENTS 7,259,828 B2   8/2007 Tolsma et al.
7,863,763 B2   1/2011 Van Haren et al.
(Continued)

FOREIGN PATENT DOCUMENTS

EP   1 788 451    5/2007
JP   2002-090979  3/2002
(Continued)

OTHER PUBLICATIONS

Japanese Office Action dated Sep. 6, 2016 in corresponding Japanese Patent Application No. 2015-562028.
(Continued)

*Primary Examiner* — Michelle M Iacoletti
(74) *Attorney, Agent, or Firm* — Pillsbury Winthrop Shaw Pittman LLP

(57) ABSTRACT

A patterning device, for use in forming a marker on a substrate by optical projection, the patterning device including a marker pattern having a density profile that is periodic with a fundamental spatial frequency corresponding to a desired periodicity of the marker to be formed. The density profile is modulated (such as sinusoidally) so as to suppress one or more harmonics of the fundamental frequency, relative to a simple binary profile having the fundamental frequency.

19 Claims, 8 Drawing Sheets

(51) Int. Cl.
*G03F 1/42* (2012.01)
*G03F 1/44* (2012.01)

(56) References Cited

U.S. PATENT DOCUMENTS

| | | |
|---|---|---|
| 7,873,504 B1 | 1/2011 | Bevis |
| 8,115,938 B2 | 2/2012 | Van Haren |
| 8,694,928 B2 | 4/2014 | Cao et al. |
| 2002/0045106 A1 | 4/2002 | Baselmans et al. |
| 2002/0071112 A1 | 6/2002 | Smith et al. |
| 2002/0183989 A1 | 12/2002 | Chien et al. |
| 2003/0133099 A1* | 7/2003 | Shiode ............... G01M 11/0264 356/124 |
| 2003/0223630 A1 | 12/2003 | Adel et al. |
| 2004/0207856 A1 | 10/2004 | Sato et al. |
| 2005/0254030 A1 | 11/2005 | Tolsma et al. |
| 2007/0114678 A1 | 5/2007 | Van Haren et al. |
| 2007/0146708 A1 | 6/2007 | Hagiwara |
| 2007/0276634 A1 | 11/2007 | Smith et al. |
| 2008/0026298 A1* | 1/2008 | Brunner ................. G03B 27/00 430/5 |
| 2009/0225331 A1 | 9/2009 | Van Haren |
| 2010/0122225 A1 | 5/2010 | Cao et al. |
| 2010/0175033 A1 | 7/2010 | Adel et al. |
| 2011/0200246 A1 | 8/2011 | Van De Kerkhof et al. |
| 2012/0133938 A1 | 5/2012 | Deckers et al. |
| 2014/0146297 A1 | 5/2014 | Vainer et al. |

FOREIGN PATENT DOCUMENTS

| | | |
|---|---|---|
| JP | 2008-225224 | 9/2008 |
| JP | 2013-011898 | 1/2013 |
| TW | 200732866 | 9/2007 |
| TW | 200746252 | 12/2007 |
| TW | 200943007 | 10/2009 |
| TW | 201232193 | 8/2012 |
| TW | 201233994 | 8/2012 |
| WO | 2012/138758 | 10/2012 |

OTHER PUBLICATIONS

International Search Report and Written Opinion mailed Jul. 8, 2014 in corresponding International Patent Application No. PCT/EP2014/054340.
Jeroen Huijbregtse et al., "Overlay Performance with Advanced ATHENA™ Alignment Strategies," Proc. of SPIE, vol. 5038, pp. 918-928 (2003).
Taiwan Office Action dated Aug. 14, 2015 in corresponding Taiwan Patent Application No. 103109245.

* cited by examiner

PATTERNING DEVICE, METHOD OF PRODUCING A MARKER ON A SUBSTRATE AND DEVICE MANUFACTURING METHOD

CROSS-REFERENCE TO RELATED APPLICATIONS

This application is the U.S. national phase entry of PCT patent application no. PCT/EP2014/054340, which was filed on Mar. 6, 2014, which claims the benefit of priority of U.S. provisional application No. 61/784,803, which was filed on Mar. 14, 2013, and which is incorporated herein in its entirety by reference.

FIELD

The present invention relates to a patterning device having a marker pattern, a method of producing a marker on a substrate, a substrate and a device manufacturing method using a patterning device, suitable for use in a lithographic apparatus.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

Alignment between successive patterned layers may be achieved and monitored using markers on the patterning device and on the substrate.

Markers may be used in the alignment of a wafer with respect to the wafer stage and ultimately to the image of the mask. Such markers may be referred to as "wafer align" markers.

Another type of marker can be used in the measurement of alignment that has been performed previously, rather than to achieve alignment itself. Such markers may be referred to as "process correction" markers. These markers are exposed together with the circuit pattern. After the exposure and subsequent processing, such as development and etching, the markers are then inspected using an offline inspection apparatus (measurement tool). This inspection apparatus can measure the difference in placement between markers exposed in two different layers. An example sequence using a wafer substrate is: Expose a first marker in a first layer in resist using a lithographic apparatus. Develop the resist and transfer the pattern into the wafer, by etching. Perform further processing of the wafer (for example addition and/or removal of material). Coat the wafer with resist. Expose a second marker using the lithographic apparatus. Develop the resist. Measure the relative placement between the two markers on the offline inspection apparatus. The measurement data is processed and fed back to the lithographic apparatus. Upon exposing new wafers, this data is used to correct the alignment of the exposure (of either layer).

If the markers of either type on the substrate are not applied properly to the substrate, then the accuracy of alignment may be reduced during the alignment process or correction process respectively.

SUMMARY

It is desirable to apply markers properly to the substrate, so as to improve accuracy of alignment during the alignment process and/or correction process.

According to a first aspect, there is provided a patterning device for use in forming a marker on a substrate by optical projection, the patterning device comprising a marker pattern having a density profile that is periodic in at least a first direction, a fundamental spatial frequency of the periodic density profile of said marker pattern corresponding to a desired periodicity of the marker to be formed, wherein said density profile is modulated so as to suppress one or more harmonics of said fundamental frequency, relative to a simple binary profile having the fundamental frequency.

According to a second aspect, there is provided a method of producing a marker on a substrate, the method comprising illuminating the patterning device of the first aspect with radiation, projecting an image of the marker pattern onto the substrate, and using the image to form a marker on the substrate by a lithographic process.

According to a third aspect, there is provided a substrate comprising a marker produced using the method of the second aspect.

According to a fourth aspect, there is provided a device manufacturing method, the method comprising illuminating the patterning device of the first aspect with radiation, projecting an image of the marker pattern onto a substrate, using the image to form a marker on the substrate by a lithographic process, and using the formed marker to align a subsequent lithographic process comprising: exposing a photosensitive resist coated on the substrate with an image of a circuit pattern, while using the formed marker to align the exposure or to correct alignment of the exposure, developing the resist to form a resist integrated circuit pattern and transferring the resist integrated circuit pattern to the substrate by etching to form an integrated circuit of a device.

According to a fifth aspect, there is provided a patterning device, for use with an optical projection system, comprising a periodic marker pattern with pattern features within each period that are sub-resolution with respect to the optical projection system's imaging resolution, the periodic marker pattern being configured to approximate a non-rectangular periodic pattern to suppress at least one harmonic in an image of the periodic marker pattern projected by the optical projection system, compared to an image of a rectangular periodic marker pattern without sub-resolution pattern features.

According to a sixth aspect, there is provided a method of producing a periodic marker on a substrate, the method comprising illuminating the patterning device of the fifth aspect with radiation, using an optical projection system to project an image of the periodic marker pattern onto the substrate, and using the image to form a periodic marker on the substrate.

According to a seventh aspect, there is provided a substrate comprising a periodic marker produced using the method of the sixth aspect.

According to an eighth aspect, there is provided a device manufacturing method, the method comprising illuminating the patterning device of the fifth aspect with radiation, projecting an image of the periodic marker pattern onto a substrate, using the image to form a periodic marker on the substrate by a lithographic process, and using the formed periodic marker to align a subsequent lithographic process comprising: exposing a photosensitive resist coated on the substrate with the an image of a circuit pattern, while using the formed periodic marker to align the exposure or to correct alignment of the exposure, developing the resist to form a resist integrated circuit pattern and transferring the integrated circuit pattern to the substrate by etching to form an integrated circuit of a device.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
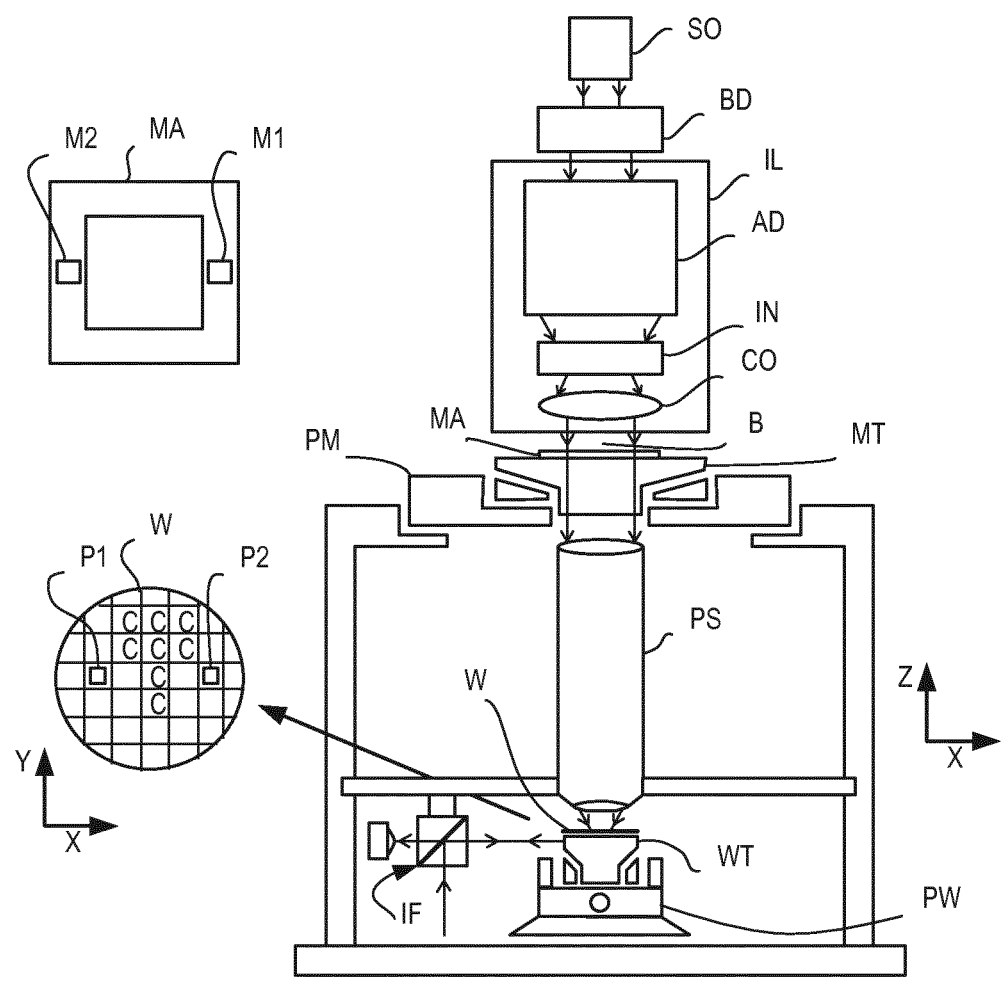
FIG. 1 depicts a lithographic apparatus according to an embodiment of the invention.

FIG. 1 schematically depicts a lithographic apparatus according to one embodiment of the invention. The apparatus comprises:

- an illumination system (illuminator) IL configured to condition a radiation beam B (e.g. UV radiation or EUV radiation).
- a support structure (e.g. a mask table) MT constructed to support a patterning device (e.g. a mask) MA and connected to a first positioner PM configured to accurately position the patterning device in accordance with certain parameters;
- a substrate table (e.g. a wafer table) WT constructed to hold a substrate (e.g. a resist-coated wafer) W and connected to a second positioner PW configured to accurately position the substrate in accordance with certain parameters; and
- a projection system (e.g. a refractive projection lens system) PS configured to project a pattern imparted to the radiation beam B by patterning device MA onto a target portion C (e.g. comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure supports, i.e. bears the weight of, the patterning device. It holds the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the mask and the projection system Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may comprise an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as an integrator IN and a condenser CO. The illuminator may be used to condition the radiation beam, to have a desired uniformity and intensity distribution in its cross-section.

The radiation beam B is incident on the patterning device (e.g., mask MA), which is held on the support structure (e.g., mask table MT), and is patterned by the patterning device. Having traversed the mask MA, the radiation beam B passes through the projection system PS, which focuses the beam onto a target portion C of the substrate W. With the aid of the second positioner PW and position sensor IF (e.g. an interferometric device, linear encoder or capacitive sensor), the substrate table WT can be moved accurately, e.g. so as to position different target portions C in the path of the radiation beam B. Similarly, the first positioner PM and another position sensor (which is not explicitly depicted in FIG. 1) can be used to accurately position the mask MA with respect to the path of the radiation beam B, e.g. after mechanical retrieval from a mask library, or during a scan. In general, movement of the mask table MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the mask MA, the mask alignment marks may be located between the dies.

The depicted apparatus could be used in at least one of the following modes:

1. In step mode, the mask table MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the mask table MT and the substrate table WT are scanned synchronously while a pattern imparted to the radiation beam is projected onto a target portion C (i.e. a single dynamic exposure). The velocity and direction of the substrate table WT relative to the mask table MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2:
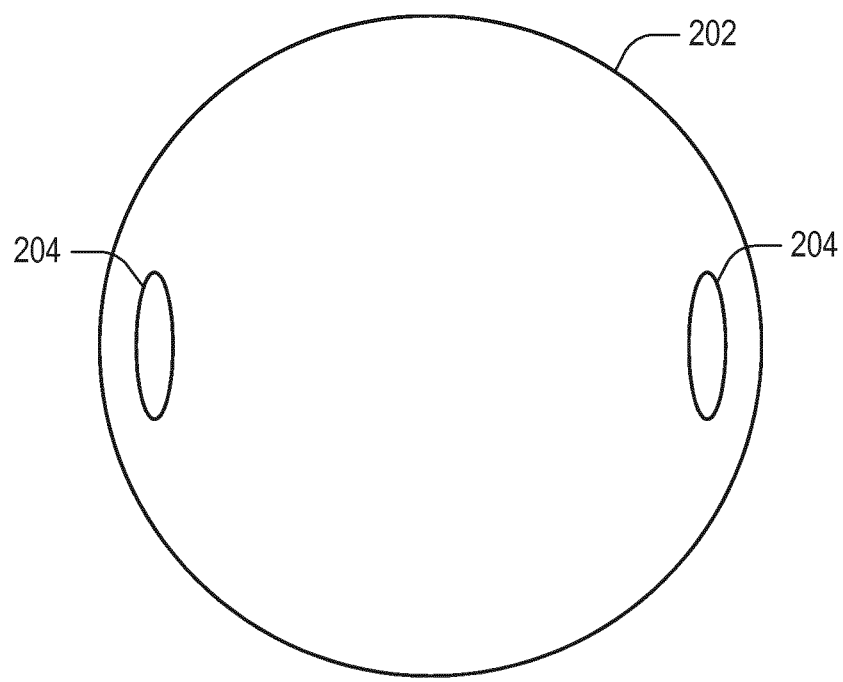
FIG. 2 illustrates a known dipole illumination profile of the intensity distribution in a pupil plane of the illuminator of a lithography apparatus, such as a scanner.

FIG. 2 illustrates a known illumination profile of the intensity distribution in a pupil plane 202 (also known as a projection pupil) of the illuminator of a lithography apparatus, such as a scanner. Typically the illumination profile is optimized. The illumination optimization is based upon the printed circuit pattern. In order to obtain optimal imaging at the highest resolution, a dipole illumination may be used. The example illumination profile in FIG. 2 is a dipole illumination profile, which is optimized to increase contrast and focus in the imaging of periodic structures. There are two diametrically opposed illumination spots 204 close to the rim of the projection pupil.

FIGS. 3a to 3d illustrate a conventional marker reticle pattern, with the imaging pupil arising from dipole illumination, such as described with reference to FIG. 2, and the resulting asymmetric aerial image and printed resist profile.

Figure 3A:
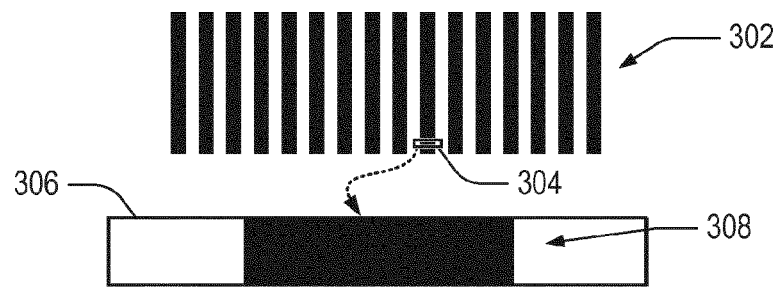
FIGS. 3a to 3d illustrate a conventional marker reticle pattern, with the imaging pupil arising from dipole illumination, such as described with reference to FIG. 2, and the resulting asymmetric aerial image intensity and printed resist profile.

With reference to FIG. 3a, a section 302 of a conventional grating reticle marker pattern is shown. Within the section 302, a line element 304 is indicated that, when repeated horizontally and vertically results in the marker pattern. An enlargement 306 of the line element 304 is also shown. The line element 304, 306 has a simple binary rectangular block shaped intensity profile 308, achieved for example with chrome lines on the reticle.

The conventional marker reticle pattern of FIG. 3a is illuminated in a lithographic apparatus, such as described with reference to FIG. 1, for this example using the illumination profile of FIG. 2. As well as the zeroth order illumination spot, higher order diffraction spots arise in the patterned radiation beam pupil of the lithographic apparatus. The diffraction spots correspond to respective harmonics of the fundamental frequency of the square wave periodic marker pattern 302.

Figure 3B:
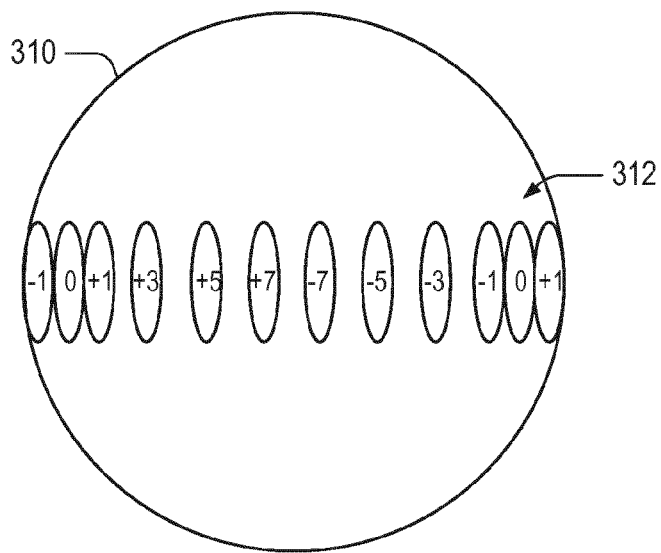

With reference to FIG. 3b, such pupil filling is illustrated with the zeroth order and +/−1st, +/−3rd, +/−5th and +/−7th order diffracted spots labeled accordingly. Diffraction order spots (not shown) to the left and right outside the pupil 310 are cut off from transmission through the optical projection system of the lithographic apparatus. In general, for a larger numerical aperture of the lithographic apparatus, higher orders may be captured by the pupil. The marker pitch is defined by the measurement apparatus (for example a wafer alignment system or a measurement tool for process correction measurements). This pitch is typically larger than the resolution of the lithographic apparatus. Therefore the diffraction order spots 312 in FIG. 3b are close together. For typical alignment marks the mark pitch is chosen such that, for the wavelength and numerical aperture in use, the two outer orders as shown in FIG. 3b (i.e −1 and +1) are not part of the pupil plane.

The inventors have found that the imaging of the alignment marks suffers from lens aberrations of the projection system. As a result the alignment marks may be printed at a different position relative to the product target portions on the substrate. In addition to this, the alignment marks may be deformed, such as being asymmetric in cross section.

As well as the problem with lens aberrations itself, when printing with extreme dipole illumination as described with reference to FIG. 2, the printing of large markers is further compromised. This is caused by a large asymmetry in the diffraction order cut off. Such "non-optimal" printing increases the aberration sensitivity. Thus a particular illumination profile (such as dipole) can make the position of the marks become even more sensitive to lens aberrations.

Figure 3C:

As a consequence, the aerial image and the resist image become asymmetric. The asymmetric aerial image intensity is illustrated in FIG. 3c, which shows the aerial intensity 314 across the substrate and a threshold 316. The aerial intensity 316 results from the superposition of the orders 312 passed by the projection system, and modified by aberrations. The photo resist response is described by a simple threshold 316 for illustration only. In general the interaction is much more complex. However, in general, an asymmetry in the aerial image will translate into an asymmetry in the resist image.

Figure 3D:
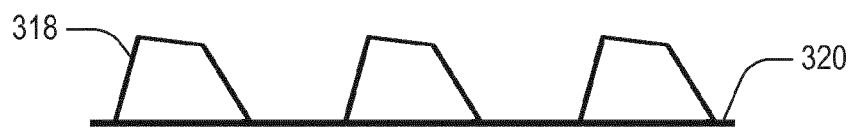

The asymmetric resist image is illustrated in FIG. 3d, which shows printed resist features 318 on a substrate 320. The asymmetry is enhanced by the "non-optimal" printing in combination with odd lens aberrations. Odd lens aberrations are those described by odd Zernike coefficients.

The measurement of the markers may be performed at a lower resolution (lower numerical aperture NA, larger wavelength) than used for printing the marker, for example using an alignment sensor in the lithographic apparatus or in a metrology tool, such as an angularly resolved scatterometer. However, the alignment sensor or metrology tool cannot separate asymmetry of the marker from position measurement.

Because the printed alignment marks are used for wafer alignment and control loops feeding back into the lithographic apparatus, the position error and deformation can cause unwanted overlay offsets between successive layers on the wafer.

Examples described herein solve both the aberration-induced position shift and the further asymmetry problem. Before describing an example solution with reference to FIGS. 5a to 5d, it is useful to consider the role of harmonics and diffraction orders in the imaging (i.e. the exposure at the wafer) of a marker.

Figure 4A:
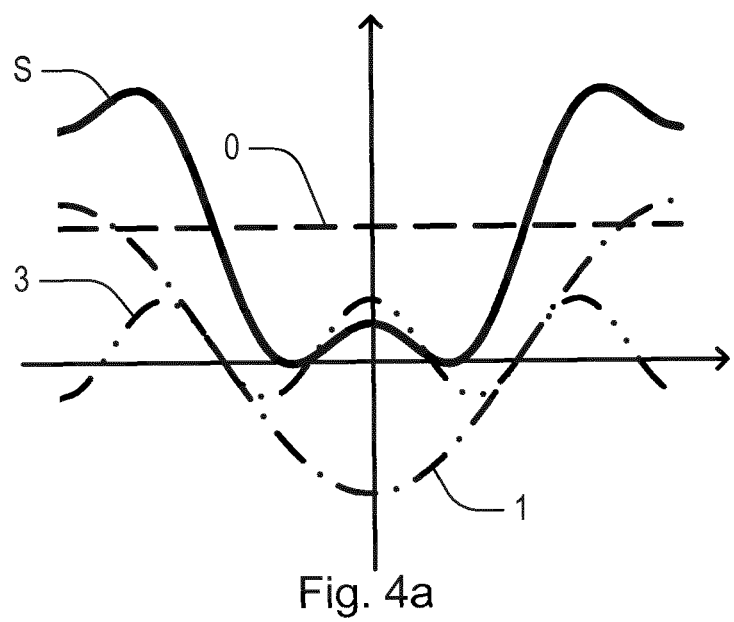
FIGS. 4a and 4b show how a rectangular block shape, for imaging of a marker, can be composed by zeroth, first and third harmonic diffraction orders.

FIG. 4a shows an example of how a binary rectangular block shape (in this example a square wave profile), for imaging of a marker, can be composed by adding zeroth order and first and third harmonic diffraction orders. These are labeled 0, 1 and 3 respectively, with the sum image being labeled S. FIG. 4a shows that the slope of the image is larger for the sum S than for the first order 1 only (the same as the sum of the zeroth 0 and first 1 orders). This slope relates directly to the contrast of the imaging. A higher slope gives better contrast.

Figure 4B:
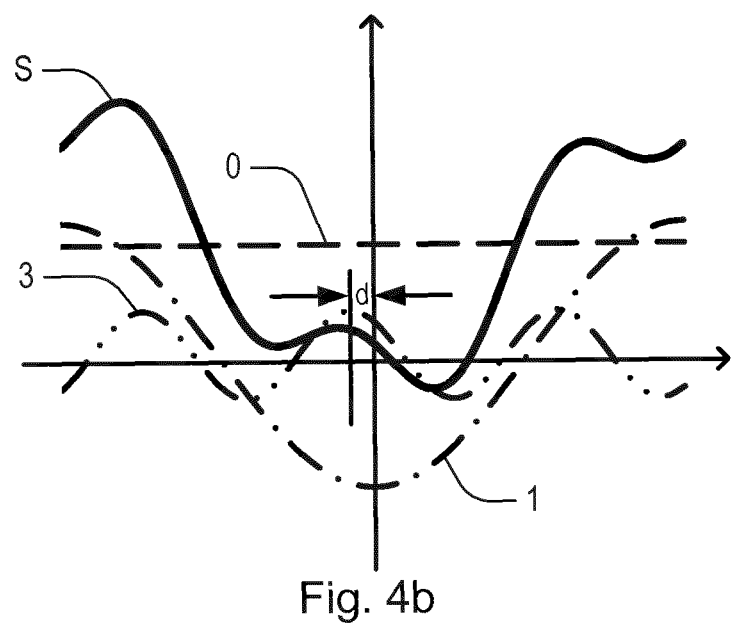

FIG. 4b has the same labeling as FIG. 4a for the same features. FIG. 4b shows generally the same curves as FIG. 4a, but now with a shift of the 3rd harmonic with respect to the 1st harmonic, indicated by the displacement d. This shift can be caused by the odd lens aberration and enhanced by reduced contrast, which is caused by the asymmetry in the diffraction order cut off ("non-optimal" printing). As a result the sum image S is shifted and deformed. This leads to the printing of shifted and deformed alignment marks, such as described with reference to FIG. 3d resulting from aberrations to 3rd, 5th and 7th harmonics.

According to examples described herein, by designing special reticle marker patterns, one can suppress at least one selected harmonic in order to select the diffraction orders which image the alignment mark at the wafer. In one example, described below with reference to FIGS. 5a to 5d, by designing the alignment mark reticle pattern such that only a maximum of three diffraction orders (zeroth and +/−1st diffraction orders) exist in the projected radiation beam, the resulting aerial image cannot be deformed.

It is known that a periodic object can be developed in a Fourier series. Each pair of diffraction orders corresponds to a certain harmonic of this series. It is also known that for illumination of an infinite thin object with sinusoidal transmission, in the far-field pattern only one spot of light on each side of the zero-order beam is observed. These are the +/−1st order spots.

FIGS. 5a to 5d illustrate marker reticle patterns sine modulated to suppress at least the 3rd, 5th and 7th harmonics, with the imaging pupil arising from dipole illumination, such as described with reference to FIG. 2, and the resulting symmetric aerial image intensity and printed resist profile, which is improved compared to the asymmetric resist profile described with reference to FIG. 3d.

Figure 5A:
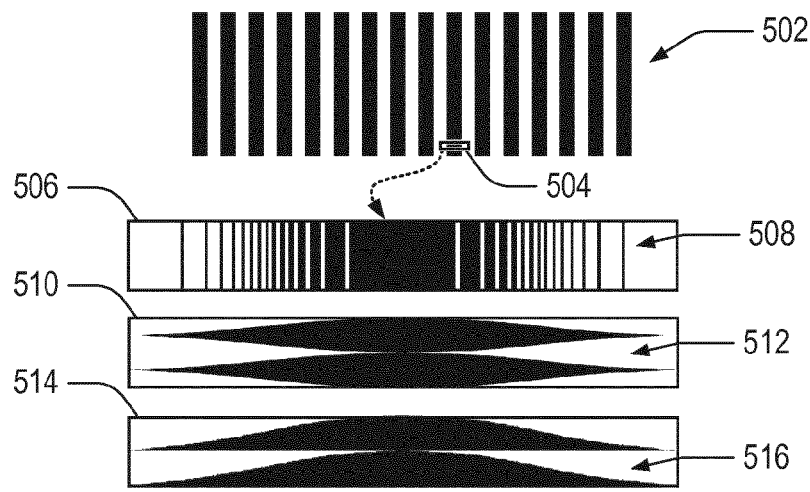
FIGS. 5a to 5d illustrate marker reticle patterns that are modulated to approximate a sinusoidal pattern to suppress at least the 3rd, 5th and 7th harmonics, with the imaging pupil arising from dipole illumination, such as described with reference to FIG. 2, and the resulting symmetric aerial image intensity and printed resist profile.

With reference to FIG. 5a, a section 502 of a grating marker reticle pattern is shown, for use in forming a marker on a substrate by optical projection. Within the section 502, a line element 504 is indicated that, when repeated horizontally and vertically results in the periodic maker pattern for use with an optical projection system. An enlargement 506 of the line element 504 is also shown. The marker pattern 502 has a repeated density profile 508, 512, 516 that is periodic in the horizontal direction. The fundamental spatial frequency is 1/the repeat period of the line elements that make up the grating. The fundamental spatial frequency of the repeated periodic density profile 508, 512, 516 of the marker pattern 502 corresponds to a desired periodicity of the marker to be formed 528. The density profile 508, 512, 516 is modulated so as to suppress one or more harmonics of the fundamental frequency, relative to a simple binary profile (308 in FIG. 3a) having the fundamental frequency. The line element 504, 506 within each period of the periodic marker 502 has pattern features 508 that are sub-resolution with respect to the optical projection system's imaging resolution, in this example a sine modulated intensity profile 508, achieved for example with chrome lines on the reticle. Line element 508, when repeated to make a periodic marker pattern is an example of a sine-type marker, modulated to suppress at least one selected harmonic (3rd, 5th, 7th, etc.), achieved using placement of sub-resolution features with varying density in the line element resulting in a sine-shaped intensity profile. The periodic marker pattern 502 is thus configured to approximate a non-rectangular periodic pattern to suppress at least one harmonic (3rd, 5th, 7th, etc.) in an image of the periodic marker pattern projected by the optical projection system, compared to an image of a rectangular periodic marker pattern without sub-resolution pattern features. Other examples of line elements that when repeated result in an approximate sinusoidal periodic marker pattern are shown by line elements 510 and 514, using sub-resolution modulation in the orthogonal direction, 512 and 516 respectively, resulting in a sine-shaped intensity profile. Thus the periodic density profile 508, 512, 516 is modulated so as to suppress in the reticle pattern all harmonics of the fundamental frequency below a certain harmonic. In this example, the certain harmonic is the lowest of the harmonics corresponding to the sub-resolution features used for the modulation, which is outside the numerical aperture of the optical projection system. Thus in this example, not all harmonics in the reticle pattern are actually suppressed. There are high harmonics in the reticle pattern that are introduced by the sub-resolution patterning. These high harmonics correspond to the high spatial frequency of the sub-resolution features. The numerical aperture filters out the high harmonics associated with the sub-resolution features. Therefore no harmonics remain in the pupil of the lithographic apparatus.

Instead of considering the harmonics in the reticle pattern, it is possible to consider the harmonics in the aerial image, where the truncation of the high harmonics associated with the sub-resolution features is performed by the optical projection system's numerical aperture. Considering this viewpoint, in this example, the periodic marker pattern is configured to approximate a sinusoidal periodic pattern to suppress all harmonics in the image of the periodic marker pattern projected by the optical projection system. In the example of line element 506, the periodic density profile is a binary profile modulated horizontally not only with the fundamental spatial frequency but with a spatial frequency or frequencies greater than the harmonics to be suppressed. In the examples of line elements 510 and 514, the periodic density profile is a binary profile modulated vertically, the vertical modulation having a spatial frequency greater than the fundamental frequency. Other sub-resolution reticle patterns (not shown) can be used to provide a sine-shaped intensity profile. For example contact holes with a diameter or spacing that varies across the line element may be used.

Alternatively, the modulated density profile may be provided by a smoothly varying density in this and other examples described herein with reference to FIGS. 7 and 8. Although some marker patterns and resulting intensity profiles are referred to as sine-type or sinusoidal, they may also be described in terms of a cosine or arcsin, for example as cosine-type or cosine gratings.

The sine-type reticle marker patterns (with line elements 506, 510, 514) of FIG. 5a may be illuminated in a lithographic apparatus, such as described with reference to FIG. 1, using the illumination profile of FIG. 2. As well as the zeroth order illumination spot, first order diffraction spots arise in the objective pupil of the lithographic apparatus. However the next higher orders are suppressed because of the sine modulation of the reticle marker patterns.

Figure 5B:
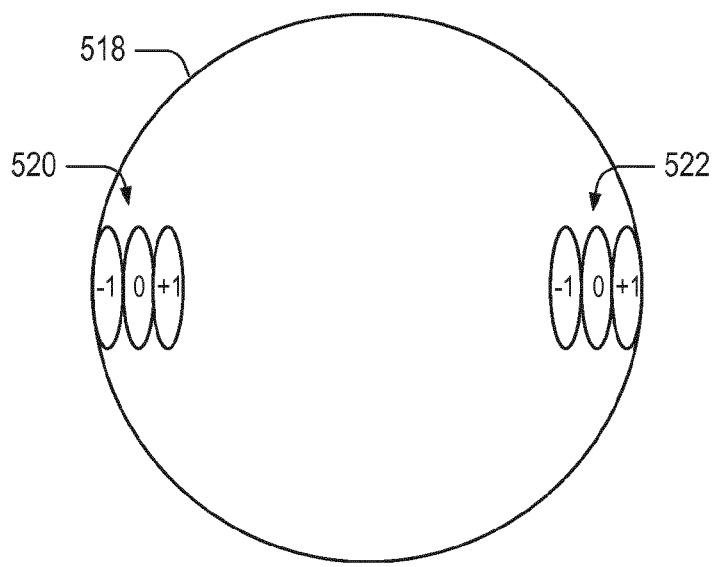

With reference to FIG. 5b, such pupil filling is illustrated with the zeroth order and +/−1st order diffracted spots labeled accordingly. Compared to FIG. 3b, in FIG. 5b the pupil 518 has only the zeroth and $1^{st}$ order spots 520 and 522, whereas higher orders, such as +/−3rd, +/−5th and +/−7th order spots are absent.

Figure 5C:
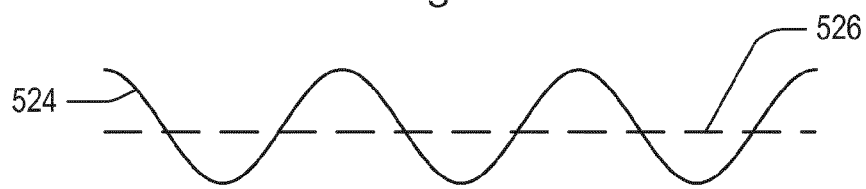

As a consequence, the aerial image and the resist image become symmetric. The symmetric aerial image intensity is illustrated in FIG. 5c, which shows the aerial intensity 524 across the substrate and a threshold 526. The aerial intensity 524 results from the superposition of the orders 520 and 522 passed by the projection system. Higher orders arising from the sub-resolution patterning of the marker reticle pattern, used to achieve the sine modulation, are outside of the pupil 518 so are cut off, leaving just the sine wave in the resulting aerial image 524.

Figure 5D:
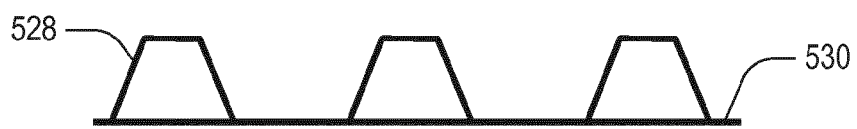

The symmetric resist image is illustrated in FIG. 5d, which shows printed resist features 528 on a substrate 530. Compared to the conventional printed marker illustrated in FIG. 3d, the symmetric printed marker of FIG. 5d does not have asymmetry because the use of the sine-modulated marker reticle pattern means that it cannot be affected by the "non-optimal" printing caused by asymmetric cut off of higher diffraction orders (because they are suppressed). Furthermore, the symmetrical printed marker of FIG. 5d does not have asymmetry because the use of the sine-modulated marker reticle pattern also avoids the effects of odd lens aberrations, because of the absence of higher diffraction orders than the first diffraction order in the imaging pupil 518.

FIG. 6 illustrates different examples with different diffraction patterns in the lithographic apparatus pupil, resulting from different illuminations of the marker pattern.

Figure 6A:
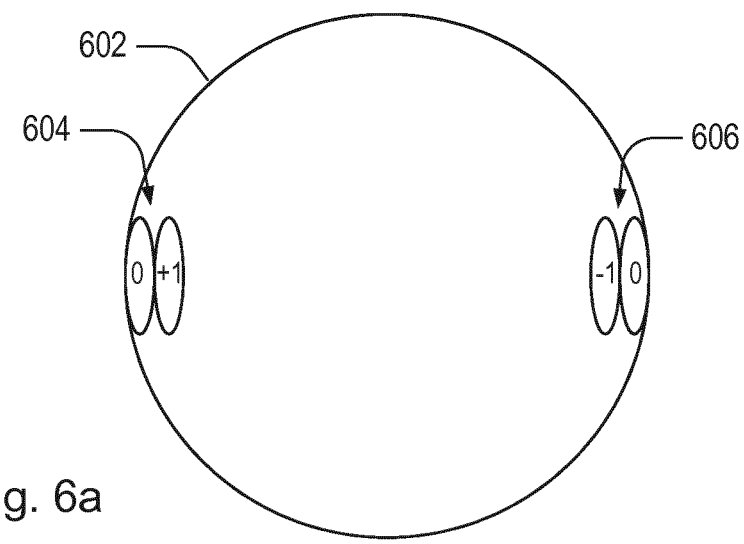
FIGS. 6a and 6b illustrate different examples with different diffraction patterns in the lithographic apparatus pupil, resulting from different illuminations of the marker pattern.

FIG. 6a shows a lithographic apparatus pupil 602 with two outer first diffraction orders having been cut off by the edge of the pupil 602. This still provides within the pupil a zeroth order spot with a +1st order spot 604 and the other zeroth order spot with a −1st order spot 606. Thus the lithographic apparatus is capable of imaging markers benefiting from the improvements with respect to position shift and deformation as described herein.

Figure 6B:
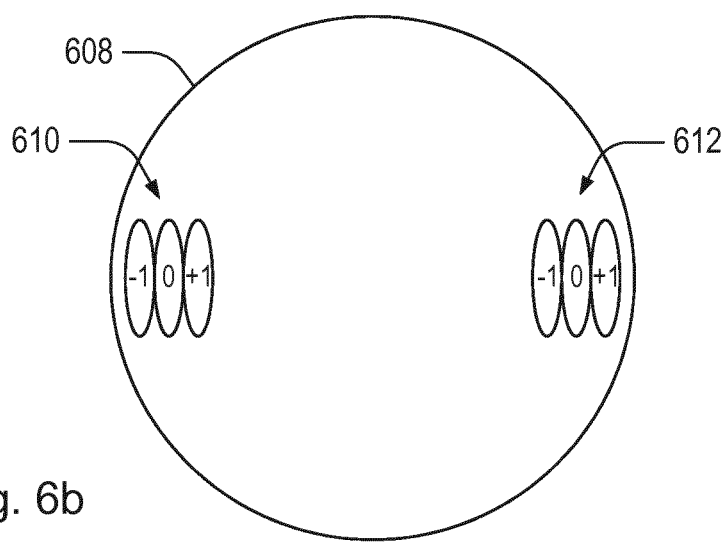

FIG. 6b shows a lithographic apparatus pupil 608 with no first diffraction orders having been cut off by the edge of the pupil 608. This is similar to the pupil 518 described with reference to FIG. 5b. It provides within the pupil two instances of a zeroth order spot with both a +1st and a −1st order spot, 610 and 612. Thus the lithographic apparatus is capable of imaging alignment marks benefiting from the improvements with respect to position shift and deformation as described herein.

FIGS. 7a to 7d illustrate a marker reticle pattern modulated to suppress at least 5th and 7th harmonics, but not the 3rd harmonic, with the imaging pupil arising from dipole illumination and the resulting symmetric aerial image intensity and printed resist profile, which is improved compared to the asymmetric resist profile described with reference to FIG. 3d.

Figure 7A:
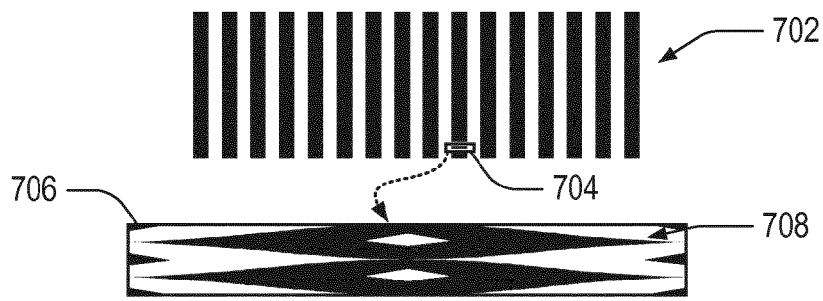
FIGS. 7a to 7d illustrate a marker reticle pattern modulated to approximate a non-rectangular periodic pattern to suppress at least the 5th and 7th harmonics, with the imaging pupil arising from dipole illumination and the resulting symmetric aerial image intensity and printed resist profile.

With reference to FIG. 7a, a section 702 of a grating marker reticle pattern is shown. Within the section 702, a line element 704 is indicated that, when repeated horizontally and vertically results in the marker. An enlargement 706 of the line element 704 is also shown. The line element 704, 706 has a modulated intensity profile 708, achieved for example with chrome lines on the reticle. Line element 708, when repeated to make a marker is an embodiment of a marker modulated to suppress at least one selected harmonic (5th, 7th, etc.), achieved using placement of sub-resolution features with varying density in the line element resulting in an approximate square-wave shaped intensity profile. For the example of FIG. 7a, the periodic marker pattern 702 is configured to approximate a periodic pattern to suppress all but the third harmonic in the image of the periodic marker pattern projected by the optical projection system. The periodic density profile 708 is modulated so as to suppress all but the third harmonic of the fundamental frequency below a certain harmonic. In this example, the certain harmonic is the lowest of the harmonics corresponding to the sub-resolution features used for the modulation, which is outside the numerical aperture of the optical projection system. Thus in this example, not all harmonics higher than the third harmonic in the reticle pattern are suppressed. There are high harmonics in the reticle pattern that are introduced by the sub-resolution patterning. These high harmonics correspond to the high spatial frequency of the sub-resolution features. The numerical aperture filters out the high harmonics associated with the sub-resolution features. Therefore no harmonics remain in the pupil of the lithographic apparatus. Other sub-resolution reticle patterns (not shown) can be used to provide a suitable intensity profile. For example contact holes with a diameter or spacing that varies across the line element may be used. The truncation of higher terms results from the modulation of the marker reticle pattern to suppress selected harmonics and also by the cut off of the even higher orders arising from the sub-resolution patterning by the limited numerical aperture of the optical projection system.

The marker reticle pattern (with line element 706) of FIG. 7a may be illuminated in a lithographic apparatus, such as described with reference to FIG. 1, using the illumination profile of FIG. 2. As well as the zeroth order illumination spot, first and third order diffraction spots arise in the objective pupil of the lithographic apparatus. However the next higher orders are suppressed because of the sine modulation of the reticle marker patterns.

Figure 7B:
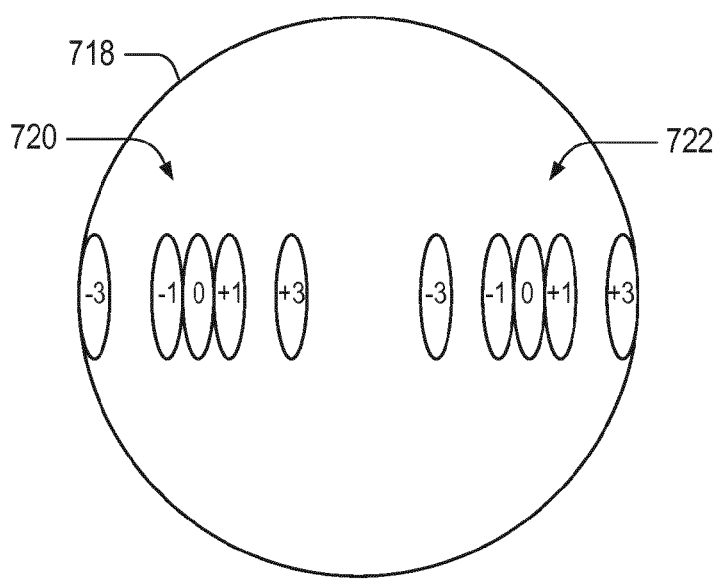

FIG. 7b shows a lithographic apparatus pupil 718 arising from a reticle marker pattern configured with a modulation that results in allowed zeroth, 1st and 3rd diffraction orders, but suppression of at least the higher 5th and 7th diffraction orders. No 3rd diffraction orders have been cut off by the edge of the pupil 614. This provides within the pupil two instances of groups of a zeroth order spot with +/−1st and +/−3rd order spots, 720 and 722. Thus the lithographic apparatus is capable of imaging markers benefiting from the improvements with respect to position shift and deformation as described herein.

Figure 7C:
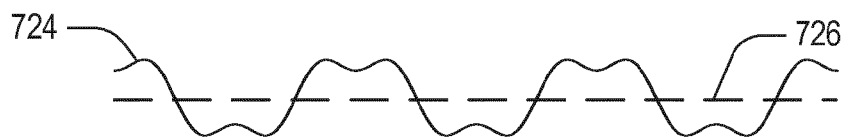

As a consequence, the aerial image and the resist image become symmetric. The symmetric aerial image intensity is illustrated in FIG. 7c, which shows the aerial intensity 724 across the substrate and a threshold 726. The aerial intensity 724 results from the superposition of the orders 720 and 722 passed by the projection system. Higher orders arising from the sub-resolution patterning of the marker reticle pattern, used to achieve the reticle marker pattern modulation, are outside of the pupil 718 so are cut off, leaving just the resulting aerial image 724. Compared to the symmetrical aerial image intensity 524 shown in FIG. 5c, the aerial image intensity 724 has a steeper gradient defining the line edge resulting from the presence of the 3rd harmonic in the latter case.

For the example described with reference to FIGS. 7b and 7c there is a tradeoff between image asymmetry and image contrast. The +/−3rd orders provide a larger slope of the aerial image, thus improving the contrast, at the expense of asymmetry effects, as described with reference to FIG. 4b. However, in this example the effects of aberrations via the 5th and 7th orders are avoided.

Figure 7D:
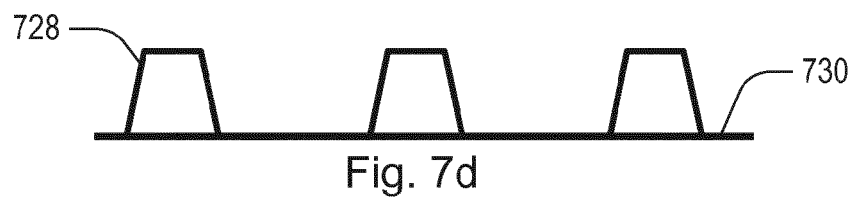

The symmetric resist image is illustrated in FIG. 7d, which shows printed resist features 728 on a substrate 730. Compared to the conventional printed marker illustrated in FIG. 3d, the symmetric printed marker of FIG. 7d does not have asymmetry because the use of the modulated marker reticle pattern 702 reduces the effects of odd lens aberrations, because of the absence of higher diffraction orders than the third diffraction order in the imaging pupil 718. Compared to the symmetrical printed resist profile 528 shown in FIG. 5d, the printed resist profile 728 has a steeper sidewall resulting from the higher contrast because of the presence of the 3rd harmonic in the latter case.

FIGS. 8a to 8d illustrate a marker reticle pattern that is phase modulated to suppress the zeroth order and modulated to suppress at least the 3rd, 5th and 7th harmonics, with the imaging pupil arising from monopole illumination, and the resulting symmetric aerial image intensity and printed resist profile.

Figure 8A:
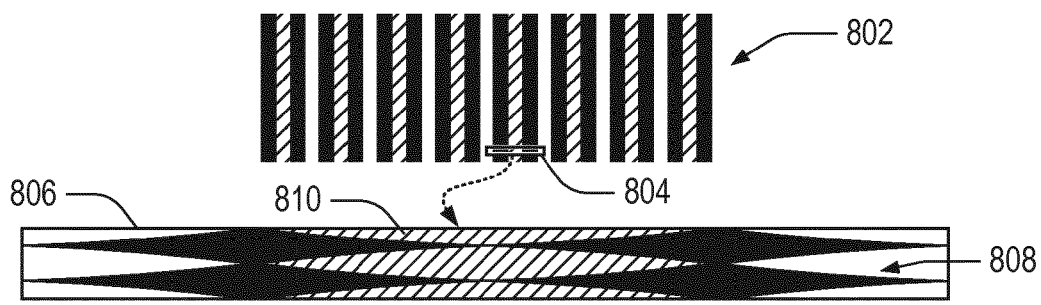
FIGS. 8a to 8d illustrate a marker reticle pattern phase modulated to suppress the zeroth order and modulated to approximate a sinusoidal pattern to suppress at least the 3rd, 5th and 7th harmonics, with the imaging pupil arising from monopole illumination, and the resulting symmetric aerial image intensity and printed resist profile.

With reference to FIG. 8a, a section 802 of a phase-shift grating marker reticle pattern is shown. Within the section 802, a line element 804 is indicated that, when repeated horizontally and vertically results in the marker. An enlargement 806 of the line element 804 is also shown. The line element 804, 806 has a modulated intensity profile 808, achieved for example with chrome lines on the reticle. The reticle pattern in this example is also an alternating phase-shift reticle pattern. The cross hatched areas in 802 and 810 in the enlarged element 808 represent out of phase (180 degree phase shifted) areas of the reticle, compared to the transparent (non-chrome) areas, shown as white. Line element 808, when repeated to make a marker is an embodiment of a sine-type marker. The marker pattern has an alternating phase shift structure having a phase shift profile that is periodic in a horizontal direction with a spatial frequency half of the fundamental spatial frequency of the periodic density profile. The periodic marker pattern has the alternating phase shifting structure to suppress the zeroth order intensity component in the image of the periodic marker pattern projected by the optical projection system. The sine-like modulation suppress at least one selected harmonic (3rd, 5th, 7th, etc.), and is achieved using placement of sub-resolution features with varying density in the line element resulting in a sine-like intensity profile, as shown in FIG. 5. Other examples of line elements that when repeated would result in a sine-type marker are shown in FIG. 5a by line elements 510 and 514, using sub-resolution modulation in the orthogonal direction, 512 and 516 respectively, resulting in a sine-shaped intensity profile. Other sub-resolution reticle patterns (not shown) can be used to provide a sine-shaped intensity profile. For example contact holes with a diameter or spacing that varies across the line element may be used.

The alternating phase-shift sine-type reticle marker pattern (with line elements 806) of FIG. 8a may be illuminated in a lithographic apparatus, such as described with reference to FIG. 1, using the illumination profile of FIG. 2. However, in this example, it is illuminated with monopole illumination, which could also have been used with the marker patterns described with reference to FIGS. 5 and 7. Using the reticle marker pattern of FIG. 8a, the zeroth order illumination spot is suppressed by the alternating phase-shift of the reticle. Only the first order diffraction spots arise in the objective pupil of the lithographic apparatus and the next higher orders (3rd, 5th, 7th, etc.) are suppressed because of the sine modulation of the marker reticle patterns.

Figure 8B:
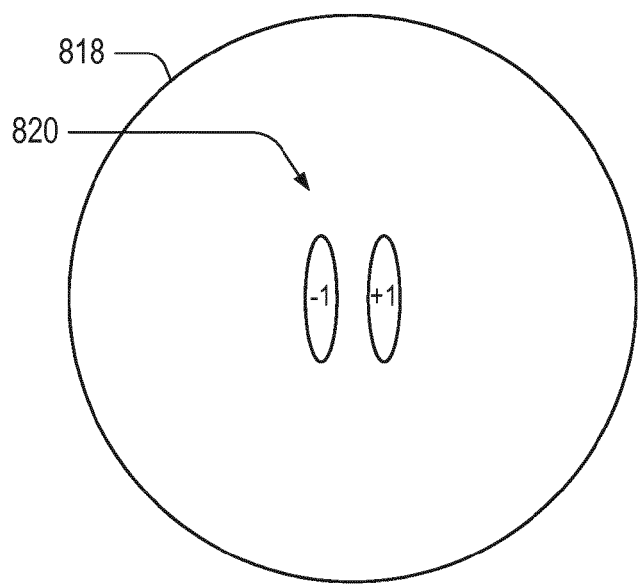

With reference to FIG. 8b, such pupil filling is illustrated with the +/−1st order diffracted spots labeled accordingly. Compared to FIG. 3b, in FIG. 8b the pupil 818 has only the 1st order spots 820, whereas the zeroth order spot and higher-than-first orders, such as +/−3rd, +/−5th and +/−7th order spots are absent.

Figure 8C:

As a consequence, the aerial image and the resist image become symmetric. This is similar to the example discussed with reference to FIG. 5. The symmetric aerial image intensity is illustrated in FIG. 8c, which shows the aerial intensity 822 across the substrate and a threshold 824. The aerial intensity 822 results from the superposition of the orders 820 passed by the projection system. Higher orders arising from the sub-resolution patterning of the marker reticle pattern, used to achieve the sine modulation, are outside of the pupil 818 so are cut off, leaving just the sine wave in the resulting aerial image 822.

Figure 8D:
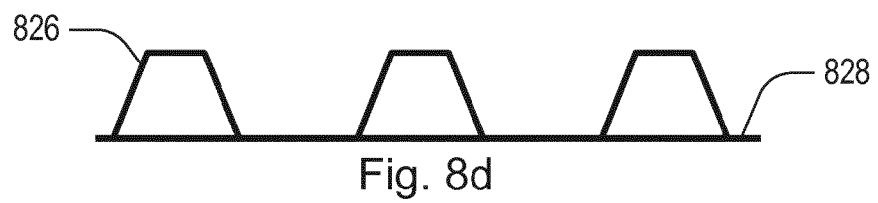

The symmetric resist image is illustrated in FIG. 8d, which shows printed resist features 826 on a substrate 828. Compared to the conventional printed marker illustrated in FIG. 3d, the symmetric printed marker of FIG. 8d does not have asymmetry because the use of the modulated reticle marker pattern means that it cannot be affected by the "non-optimal" printing caused by asymmetric cut off of higher diffraction orders (because they are suppressed). Furthermore, the symmetrical printed marker of FIG. 8d does not have asymmetry because the use of the modulated marker reticle pattern also avoids the effects of odd lens aberrations, because of the absence of higher diffraction orders than the first diffraction order in the imaging pupil 818.

The patterning device, as described above with references to FIGS. 5 to 8, typically has a circuit pattern as well as the periodic marker pattern. The periodic marker pattern is configured for aligning an exposure or correcting alignment of an exposure using the circuit pattern in a lithographic process.

Substrates may be produced by illuminating a patterning device, as described above with references to FIGS. 5 to 8, with radiation, projecting an image of the marker pattern onto the substrate, and using the image to form a marker on the substrate by a lithographic process. The lithographic process can include exposing a photosensitive resist coated on the substrate with the image and developing the resist to form a resist marker pattern. The lithographic process may further include transferring the resist marker pattern to the substrate by etching to form the marker.

A device manufacturing method may be performed by illuminating a patterning device, as described above with references to FIGS. 5 to 8, with radiation, projecting an image of the marker pattern onto a substrate, using the image to form a marker on the substrate by a lithographic process, and using the formed marker to align a subsequent lithographic process. The subsequent lithographic process can include: exposing a photosensitive resist coated on the substrate with an image of a circuit pattern, while using the formed marker to align the exposure or to correct alignment of the exposure, developing the resist to form a resist integrated circuit pattern and transferring the resist integrated circuit pattern to the substrate by etching to form an integrated circuit of a device.

Examples described herein provide higher accuracy of overlay readout because resist features are no longer or are less asymmetric resulting in more accurate measured overlay values in a process flow. Examples described herein also provide larger process robustness because the lack of the higher orders in the projected radiation means that focus/dose sensitivity will be less. Examples described herein also make oblique markers less sensitive to lens aberrations.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g. having a wavelength of or about 365, 355, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

The invention claimed is:

1. A patterning device for use in forming a marker on a substrate by optical projection, the patterning device comprising a marker pattern having a density profile that is periodic in at least a first direction, a fundamental spatial frequency of the periodic density profile of the marker pattern corresponding to a desired periodicity of the marker to be formed, wherein the density profile is modulated so as to suppress one or more harmonics of the fundamental frequency, relative to a simple binary profile having the fundamental frequency and the density profile comprises one or more pattern elements having three or more different widths.

2. The patterning device of claim 1, wherein the periodic density profile is a binary profile modulated in a second direction orthogonal to the first direction, the modulation in the second direction having a spatial frequency greater than the fundamental frequency.

3. The patterning device of claim 1, wherein the periodic density profile is a binary profile modulated in the first direction not only with the fundamental spatial frequency but with a spatial frequency or frequencies greater than the harmonics to be suppressed.

4. The patterning device of claim 1, wherein the periodic density profile is modulated so as to suppress all harmonics of the fundamental frequency below a certain harmonic.

5. The patterning device of claim 1, wherein the periodic density profile is modulated so as to suppress all but the third harmonic of the fundamental frequency below a certain harmonic.

6. A method of producing a marker on a substrate, the method comprising illuminating the patterning device of claim 1 with radiation, projecting an image of the marker pattern onto the substrate, and using the image to form a marker on the substrate by a lithographic process.

7. A substrate comprising a marker produced using the method of claim 6.

8. A device manufacturing method, the method comprising producing a marker on a substrate as recited in claim 6, and using the formed marker for alignment in a subsequent lithographic process comprising: exposing a photosensitive resist coated on the substrate with an image of a circuit pattern, while using the formed marker to align the exposure or to correct alignment of the exposure, developing the resist to form a resist integrated circuit pattern and transferring the resist integrated circuit pattern to the substrate by etching to form an integrated circuit of a device.

9. A patterning device, for use with an optical projection system, comprising a periodic marker pattern with pattern features within each period that are sub-resolution with respect to the optical projection system's imaging resolution, wherein the pattern features are non-rectangular shaped or spaced apart at three or more different distances, to suppress at least one harmonic in an image of the periodic marker pattern projected by the optical projection system, compared to an image of a rectangular periodic marker pattern without sub-resolution pattern features.

10. The patterning device of claim 9, wherein the periodic marker pattern is configured to approximate a sinusoidal periodic pattern to suppress all harmonics in the image of the periodic marker pattern projected by the optical projection system.

11. The patterning device of claim 9, wherein the periodic marker pattern is configured to approximate a non-rectangular periodic pattern to suppress all but the third harmonic in the image of the periodic marker pattern projected by the optical projection system.

12. The patterning device of claim 9, wherein the periodic marker pattern further comprises an alternating phase shift structure to suppress a zeroth order intensity component in the image of the periodic marker pattern projected by the optical projection system.

13. The patterning device of claim 9, wherein the patterning device comprises a circuit pattern and the periodic marker pattern is configured for aligning an exposure or correcting alignment of an exposure using the circuit pattern in a lithographic process.

14. A method of producing a periodic marker on a substrate, the method comprising illuminating the patterning device of claim 9 with radiation, using an optical projection system to project an image of the periodic marker pattern onto the substrate, and using the image to form a periodic marker on the substrate.

15. A substrate comprising a periodic marker produced using the method of claim 14.

16. A device manufacturing method, the method comprising producing a periodic marker on a substrate as recited in claim 14, and using the formed periodic marker to align a subsequent lithographic process comprising: exposing a photosensitive resist coated on the substrate with the an image of a circuit pattern, while using the formed periodic marker to align the exposure or to correct alignment of the exposure, developing the resist to form a resist integrated circuit pattern and transferring the integrated circuit pattern to the substrate by etching to form an integrated circuit of a device.

17. A patterning device for use in forming a marker on a substrate by optical projection, the patterning device comprising a marker pattern having a density profile that is periodic in at least a first direction, a fundamental spatial frequency of the periodic density profile of the marker pattern corresponding to a desired periodicity of the marker to be formed, wherein the density profile is modulated so as to suppress one or more harmonics of the fundamental frequency, relative to a simple binary profile having the fundamental frequency and wherein the periodic density profile is modulated so as to suppress all harmonics, or all but the third harmonic, of the fundamental frequency below a certain harmonic.

18. A patterning device, for use with an optical projection system, comprising a periodic marker pattern with pattern features within each period that are sub-resolution with respect to the optical projection system's imaging resolution, the periodic marker pattern being configured to approximate a non-rectangular periodic pattern to suppress at least one harmonic in an image of the periodic marker pattern projected by the optical projection system, compared to an image of a rectangular periodic marker pattern without sub-resolution pattern features, wherein the periodic marker pattern is configured to approximate a sinusoidal periodic pattern to suppress all harmonics, or configured to approximate a non-rectangular periodic pattern to suppress all but the third harmonic, in the image of the periodic marker pattern projected by the optical projection system.

19. A patterning device, for use with an optical projection system, comprising a periodic marker pattern with pattern features within each period that are sub-resolution with respect to the optical projection system's imaging resolution, the periodic marker pattern being configured to approximate a non-rectangular periodic pattern to suppress at least one harmonic in an image of the periodic marker pattern projected by the optical projection system, compared to an image of a rectangular periodic marker pattern without sub-resolution pattern features, wherein the periodic marker pattern further comprises an alternating phase shift structure to suppress a zeroth order intensity component in the image of the periodic marker pattern projected by the optical projection system.

\* \* \* \* \*